US009502237B2

(12) United States Patent
Yamaguchi et al.

(10) Patent No.: US 9,502,237 B2
(45) Date of Patent: Nov. 22, 2016

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Takatomo Yamaguchi, Toyama (JP); Shuhei Saido, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 20 days.

(21) Appl. No.: 14/498,392

(22) Filed: Sep. 26, 2014

(65) Prior Publication Data
US 2015/0152551 A1 Jun. 4, 2015

(30) Foreign Application Priority Data

Nov. 29, 2013 (JP) .................................. 2013-247716

(51) Int. Cl.
*H01L 21/02* (2006.01)
*H01L 21/308* (2006.01)
*C23C 16/455* (2006.01)
*C23C 16/44* (2006.01)
*H01L 21/285* (2006.01)
*H01L 21/768* (2006.01)

(52) U.S. Cl.
CPC ....... *H01L 21/0228* (2013.01); *C23C 16/4408* (2013.01); *C23C 16/45527* (2013.01); *C23C 16/45565* (2013.01); *C23C 16/45574* (2013.01); *C23C 16/45576* (2013.01);

(Continued)

(58) Field of Classification Search
CPC ... H01L 21/00; H01L 21/311; H01L 21/027; H01L 21/308; H01L 21/302; H01L 21/461; H01L 21/02; H01L 21/0228; H01L 21/02186; H01L 21/02271; H01L 21/02263; H01L 21/02252; H01L 21/02312; H01L 21/67017; H01L 21/67; C23C 16/00; C23C 16/455; C23C 16/52; C23C 16/44
USPC .......................... 438/785, 689, 758, 769, 778
See application file for complete search history.

(56) References Cited

U.S. PATENT DOCUMENTS 5,935,373 A * 8/1999 Koshimizu ........... H01J 37/321
118/723 I
6,257,168 B1 * 7/2001 Ni ..................... H01J 37/32623
118/723 R (Continued)

FOREIGN PATENT DOCUMENTS

JP 1997045624 2/1997
JP 2005507159 3/2005

(Continued)

*Primary Examiner* — Chuong A Luu
(74) *Attorney, Agent, or Firm* — Edell, Shapiro & Finnan, LLC

(57) ABSTRACT

Provided are a substrate processing apparatus, a method of manufacturing a semiconductor device and a non-transitory computer-readable recording medium. The substrate processing apparatus includes a process chamber configured to process a substrate; a gas supply unit including gas supply holes configured to independently supply a process gas for processing the substrate to each of a central portion of the substrate and a peripheral portion of the substrate in the process chamber; an exhaust unit configured to exhaust an inside of the process chamber; and a control unit configured to control the gas supply unit to supply the process gas to the central portion of the substrate after the process gas is supplied to the peripheral portion of the substrate through the gas supply unit.

13 Claims, 14 Drawing Sheets

(52) U.S. Cl.
CPC .. *C23C 16/45582* (2013.01); *H01L 21/28512* (2013.01); *H01L 21/76877* (2013.01)

(56) References Cited

U.S. PATENT DOCUMENTS 6,403,491 B1 * 6/2002 Liu .................. H01J 37/32522
257/E21.252

2010/0041238 A1   2/2010 Cooperberg et al.
2013/0180951 A1 * 7/2013 Indrakanti ......... H01L 21/31116
216/41

FOREIGN PATENT DOCUMENTS

JP    2007243138    9/2007
JP    2012153932    8/2012

* cited by examiner

CROSS-SECTIONAL VIEW
TAKEN ALONG LINE A-A

CROSS-SECTIONAL VIEW
TAKEN ALONG LINE B-B

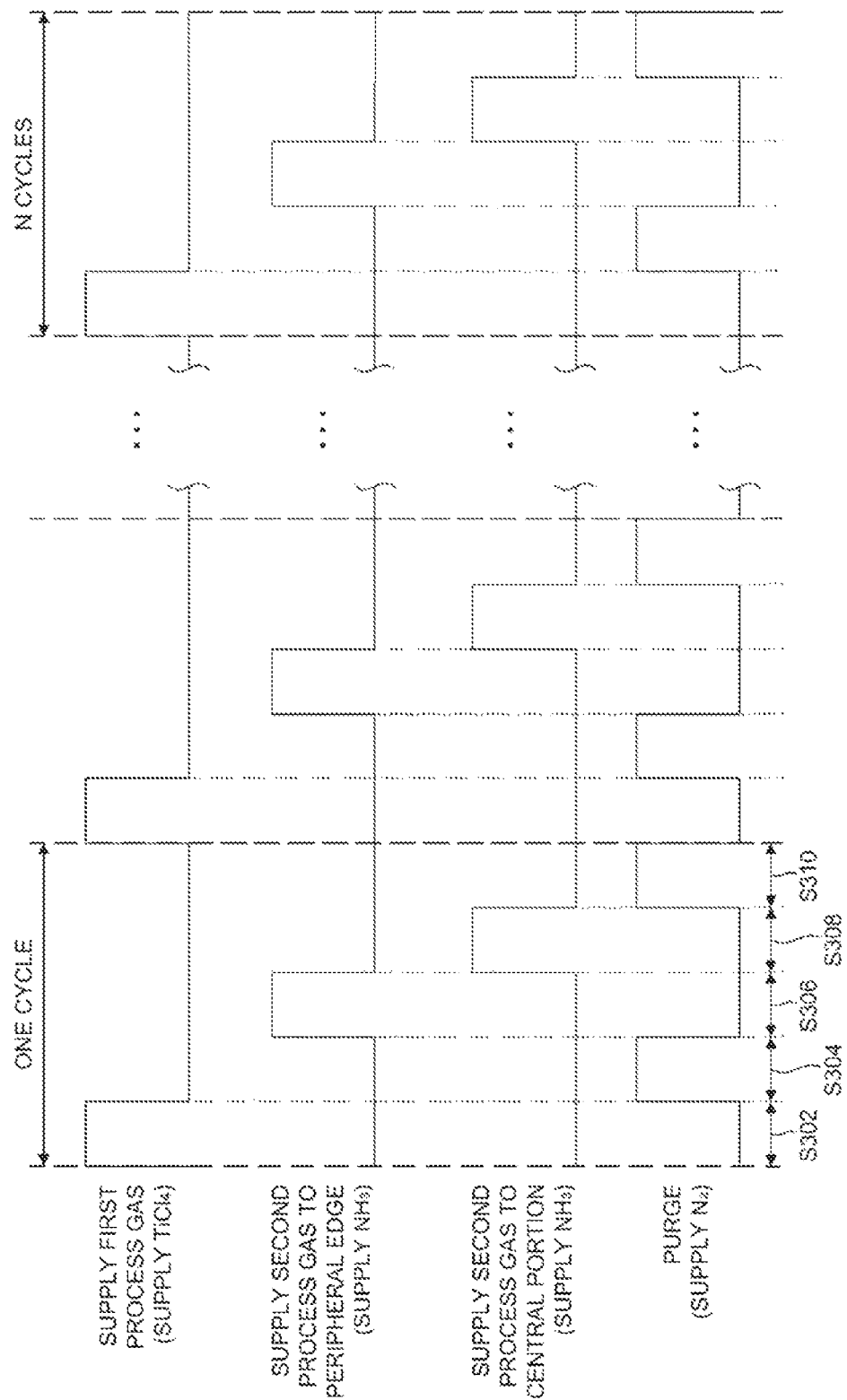

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application claims foreign priority under 35 U.S.C. §119(a)-(d) to Application No. JP 2013-247716 filed on Nov. 29, 2013, entitled "Substrate Processing Apparatus, Method of Manufacturing Semiconductor Device and Non-Transitory Computer-Readable Recording Medium," the entire contents of which are hereby incorporated by reference.

FIELD OF THE INVENTION

The present invention relates to a substrate processing apparatus, a method of manufacturing a semiconductor device and a non-transitory computer-readable recording medium.

BACKGROUND

In recent years, semiconductor devices, such as flash memories, have tended to become highly integrated. Thus, a pattern size is markedly being downscaled. When a pattern is formed, a predetermined processing process, such as an oxidation process or a nitridation process, may be performed on a substrate as one of manufacturing processes.

As a method of forming the pattern, a groove is formed between circuits, and a liner film or interconnection is formed within the groove. The groove is configured to have a high aspect ratio with the recent miniaturization.

When the liner film is formed, it is necessary to form a film having good step coverage, which has no deviation in film thickness, on an upper side surface, a middle side surface, a lower side surface and bottom portion of the groove. By forming the film having the good step coverage, characteristics of a semiconductor device may be uniformized, so that deviations in the characteristics of the semiconductor device may be inhibited.

To process the groove having the high aspect ratio, a process of processing the groove by heating gases or using gases in a plasma state has been attempted, but it is difficult to form a film having good step coverage.

As methods of forming the film, there are a chemical vapor deposition (CVD) method and an atomic layer deposition (ALD) method of forming films by causing a reaction between at least two types of process gases.

Here, since it is necessary to uniformize characteristics of a semiconductor substrate, gases need to be uniformly supplied to an in-plane surface of the substrate when forming a thin film. To realize the uniform supplying of the gases, a single-wafer-type apparatus capable of uniformly supplying gases to a process surface of the substrate is being developed. In the single-wafer-type apparatus, for example, a shower head including a buffer chamber is installed over the substrate to supply gases more uniformly.

Conventionally, a technique of improving in-plane uniformity of a film forming process by uniformizing the amount of process gas consumed due to the film forming process and the amount of process gas supplied to a process space through a head unit per unit area using a structure in which a support body of a processed body has the same diameter as a shower head unit, a technique of forming a gas introduction unit in such a shape as to protrude into a process chamber and installing a plurality of gas introduction holes to be opened in different directions such that gases do not diffuse due to a distance between a shower head and a lower electrode on which a substrate is placed when a poly silicon (poly-Si) layer disposed on the substrate is etched using the shower head, and a technique of installing an on-axis spray supply hole of supplying a process gas to a first region by which the process gas is supplied in an axial direction vertical to a surface of a substrate and an off-axis spray supply hole of supplying a process gas to a second region by which the process gas is supplied in an inclined direction, have been developed.

When a desired film is formed by at least two types of process gases using a single-wafer-type apparatus, the film is formed by causing a reaction between the at least two types of process gases above a substrate or on a surface of the substrate. However, in a conventional apparatus configured to supply gases via a buffer chamber, it is inferred that the gases react in the buffer chamber to generate byproducts in the buffer chamber. There are some cases in which the generated byproducts adversely affect characteristics of a substrate.

In addition, when a gas supply process is performed using a shower head in a single-wafer-type apparatus, since a distance by which a reactive gas uniformly flowing out through the shower head flows on a surface of a substrate varies according to an outflow spot, in-plane uniformity deteriorates.

SUMMARY

It is a main object of the present invention to provide a substrate processing apparatus, a method of manufacturing a semiconductor device and a non-transitory computer-readable recording medium, which may solve the above-described problems, inhibit generation of byproducts, and improve uniformity in an in-plane surface of a substrate.

According to one aspect of the present invention, there is provided a substrate processing apparatus including: a process chamber configured to process a substrate; a gas supply unit including gas supply holes configured to independently supply a process gas for processing the substrate to each of a central portion of the substrate and a peripheral portion of the substrate in the process chamber; an exhaust unit configured to exhaust an inside of the process chamber; and a control unit configured to control the gas supply unit to supply the process gas to the central portion of the substrate after the process gas is supplied to the peripheral portion of the substrate through the gas supply unit.

According to another aspect of the present invention, there is provided a method of processing a substrate, (a) transferring the substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto a central portion of the substrate by the gas supply unit after performing the step (b).

According to another aspect of the present invention, there is provided a method of manufacturing a semiconductor device, the method including: (a) transferring a substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto a central portion of the substrate by the gas supply unit after performing the step (b).

BRIEF DESCRIPTION OF THE DRAWINGS

FIG. 11 is a timing chart illustrating gas supply timing in a film forming process according to a third exemplary embodiment of the present invention.

DETAILED DESCRIPTION

One embodiment of the present invention will now be described with reference to the accompanying drawings.

To begin with, a substrate processing apparatus according to an exemplary embodiment of the present invention will be described.

Figure 1:
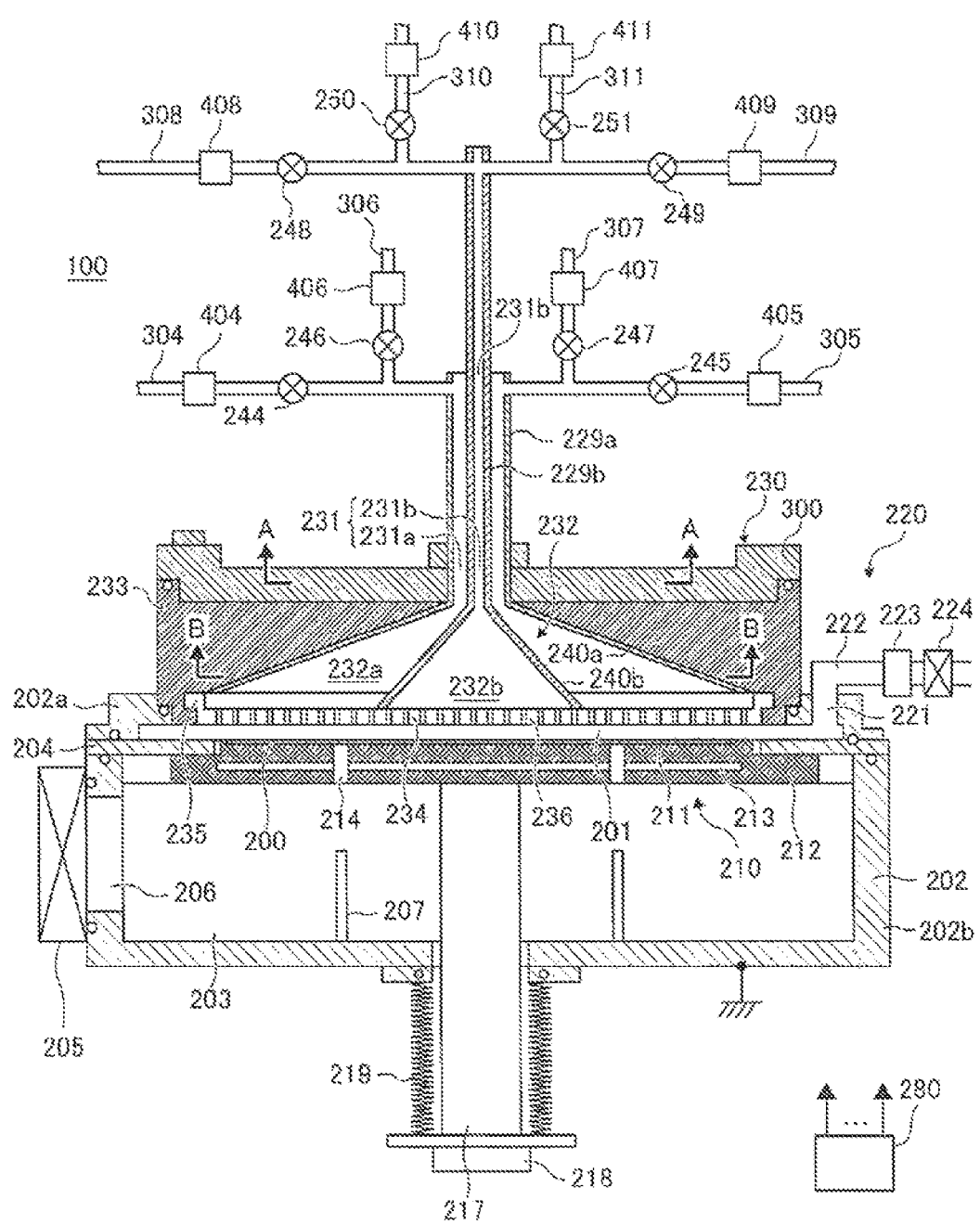
FIG. 1 is a longitudinal sectional view of a substrate processing apparatus according to an exemplary embodiment of the present invention.
Figure 2:
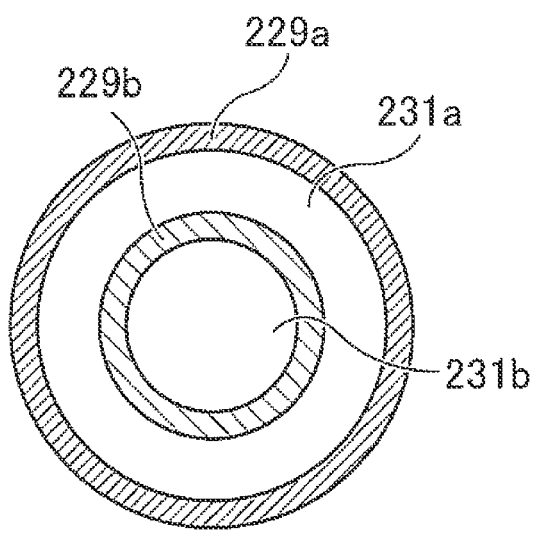
FIG. 2 is a cross-sectional view of a gas introduction port shown in FIG. 1, which is taken along line A-A of FIG. 1.
Figure 3:
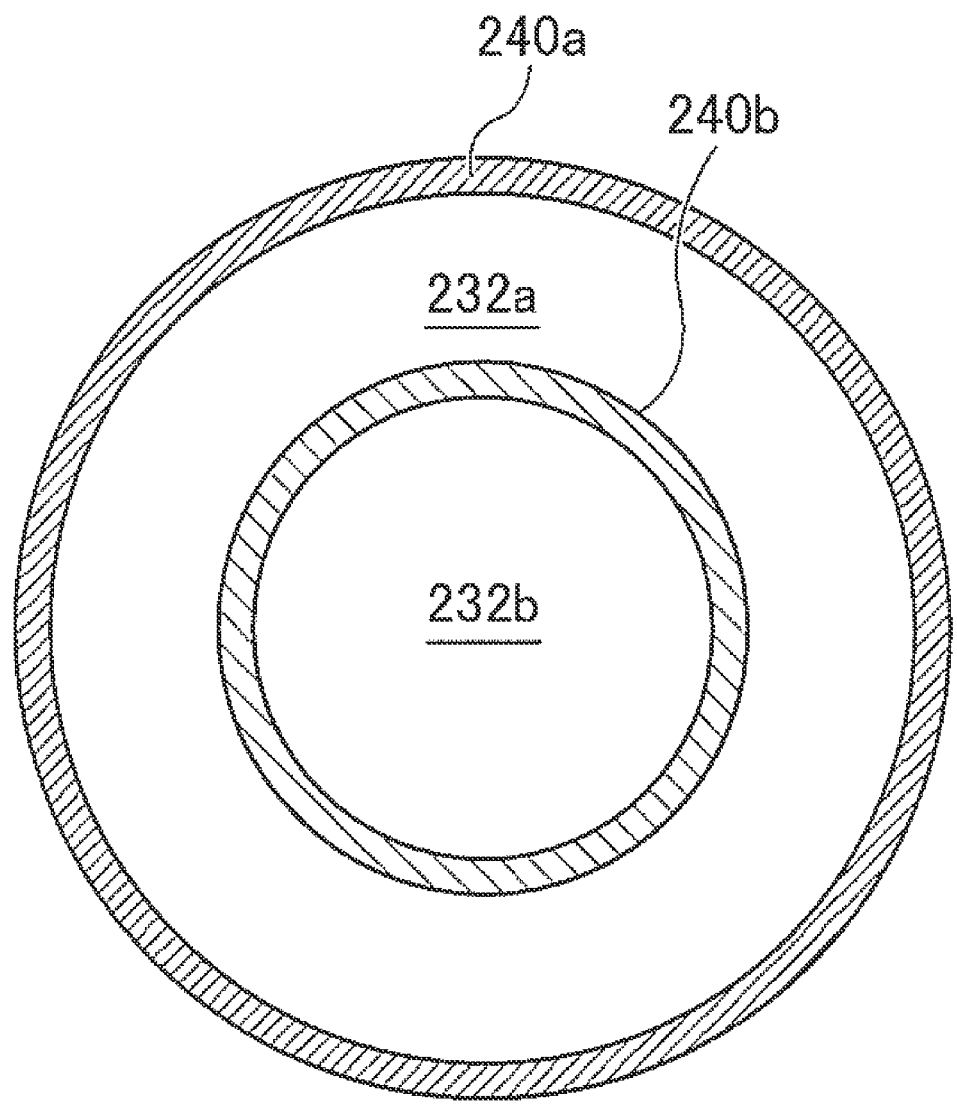
FIG. 3 is a cross-sectional view of a buffer space shown in FIG. 1, which is taken along line B-B of FIG. 1.
Figure 4:
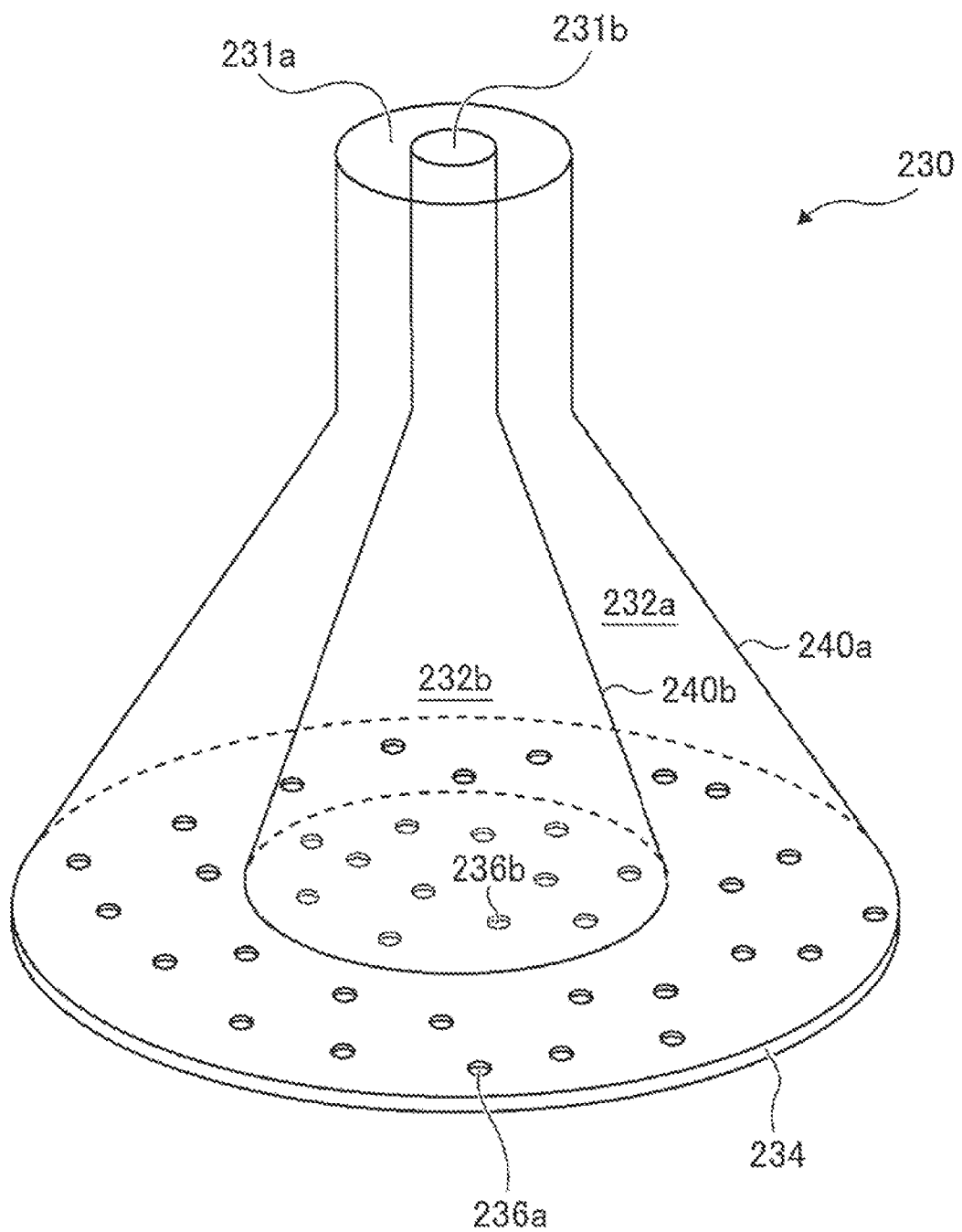
FIG. 4 is a schematic perspective view of the buffer space of a shower head according to an exemplary embodiment of the present invention.

A substrate processing apparatus 100 according to the present embodiment is a unit for forming a high-k insulating film, and configured as a single-wafer-type substrate processing apparatus as shown in FIG. 1. FIG. 1 is a longitudinal sectional view of the substrate processing apparatus 100 according to an exemplary embodiment of the present invention. FIG. 2 is a cross-sectional view of a gas introduction port 231 shown in FIG. 1, which is taken along line A-A of FIG. 1. FIG. 3 is a cross-sectional view of a buffer space 232 shown in FIG. 1, which is taken along line B-B of FIG. 1. FIG. 4 is a schematic perspective view of the buffer space 232 of a shower head 230 according to an exemplary embodiment of the present invention.

The substrate processing apparatus 100 includes a process container 202. The process container 202 is configured as, for example, a planar airtight container having a circular cross-section. Also, the process container 202 is formed of, for example, a metal material, such as aluminum (Al) or stainless steel (SUS). A process space 201 serving as a process chamber for processing a wafer 200 (e.g., silicon wafer) which is a substrate and a transfer space 203 are formed in the process container 202. The process container 202 is configured by an upper container 202a and a lower container 202b. A partition plate 204 is installed between the upper container 202a and the lower container 202b. A space surrounded by the upper container 202a above the partition plate 204 will be referred to as the process space 201, and a space surrounded with the lower container 202b below the partition plate 204 will be referred to as the transfer space 203.

A substrate loading/unloading port 206 is installed in a side surface of the lower container 202b and adjacent to a gate valve 205, and the wafer 200 moves between the lower container 202b and a transfer chamber (not shown) via the substrate loading/unloading port 206. A plurality of lift pins 207 are installed on a bottom portion of the lower container 202b. Also, the lower container 202b is grounded.

A substrate support unit 210 for supporting the wafer 200 is installed in the process space 201. The substrate support unit 210 mainly includes a placing surface 211 for placing the wafer 200, a substrate placing table 212 having the placing surface 211 disposed on a surface thereof, and a heater 213 which is a heating source embedded in the substrate placing table 212. Through holes 214 which are penetrated by the lift pins 207 are respectively installed at positions corresponding to the lift pins 207.

The substrate placing table 212 is supported by a shaft 217. The shaft 217 penetrates a bottom portion of the process container 202 and is connected to an elevating mechanism 218 outside the process container 202. By moving the shaft 217 and the substrate placing table 212 upward/downward by operating the elevating mechanism 218, the wafer 200 placed on the placing surface 211 may be moved upward/downward. Also, the circumference of a lower end portion of the shaft 217 is coated with a bellows 219, and the inside of the process container 202 is air-tightly retained.

The substrate placing table 212 is moved downward during the transfer of the wafer 200 until the placing surface 211 is in a position (wafer transfer position) of the substrate loading/unloading port 206. During the processing of the wafer 200, the substrate placing table 212 is moved upward until the wafer 200 is in a process position (wafer process position) of the process space 201 as shown in FIG. 1.

Specifically, when the substrate placing table 212 is moved downward to the wafer transfer position, upper end portions of the lift pins 207 protrude from a top surface of the placing surface 211 so that the lift pins 207 can support the wafer 200 from below. Also, when the substrate placing table 212 is moved upward to the wafer process position, the lift pins 207 are buried from a top surface of the placing surface 211 so that the placing surface 211 can support the wafer 200 from below. Also, since the lift pins 207 are in direct contact with the wafer 200, the lift pins 207 are preferably formed of a material, such as quartz or alumina.

An exhaust port 221 for exhausting an atmosphere of the process space 201 is installed in a side surface of an inner wall of the process space 201 [upper container 202a]. An exhaust pipe 222 is connected to the exhaust port 221, and an auto pressure controller (APC) valve (e.g., APC) 223 for controlling the inside of the process space 201 to a predetermined pressure and a vacuum pump 224 are sequentially connected in series to the exhaust pipe 222. An exhaust unit 220 is mainly configured by the exhaust port 221, the exhaust pipe 222, the APC valve 223, and the vacuum pump 224.

A gas introduction port 231 for supplying various gases into the process space 201 is installed in a top surface (ceiling wall) of a shower head 230, to be described below, installed over the process space 201.

As shown in FIG. 2, the gas introduction port 231 is configured by a first gas introduction port 231a and a second gas introduction port 231b. The gas introduction port 231 has a dual pipe structure in which a second gas introduction pipe 229b forming the second gas introduction port 231b is installed as a concentric circle inside a first gas introduction pipe 229a forming the first gas introduction port 231a. Here, the first gas introduction port 231a preferably has about the same sectional area as the second gas introduction port 231b.

The shower head 230 which is a gas supply unit is installed between the gas introduction port 231 and the process space 201. The gas introduction port 231 is connected to a lid 300 of the shower head 230, and gases introduced through the gas introduction port 231 are supplied into a buffer space 232 of the shower head 230.

The lid 300 of the shower head 230 is formed of a conductive metal and used as an electrode for generating plasma in the buffer space 232 or in the process space 201. An insulating block 233 is installed between the lid 300 and the upper container 202a and electrically insulates the lid 300 from the upper container 202a.

As shown in FIGS. 3 and 4, the buffer space 232 includes a first buffer space 232a which communicates with the first gas introduction port 231a, and a second buffer space 232b which communicates with the second gas introduction port 231b.

The shower head 230 includes a dispersion plate 234 for dispersing gases introduced through the gas introduction port 231 between the buffer space 232 and the process space 201. A plurality of through holes 236 which are gas supply holes are installed in the dispersion plate 234. The through holes 236 include through holes 236a through which the first buffer space 232a communicates with the process space 201, and through holes 236b through which the second buffer space 232b communicates with the process space 201. The through holes 236 may have slit shapes that collectively form a partially continuous circle on a circumference. The dispersion plate 234 is disposed opposite the placing surface 211 and preferably has about the same diameter as the wafer 200.

Specifically, a gas guide 240a for supplying gases supplied through the first gas introduction port 231a via the through holes 236a toward the process space 201 and a gas guide 240b for supplying gases supplied through the second gas introduction port 231b via the through holes 236b toward the process space 201 are installed in the buffer space 232. That is, the buffer space 232 is divided into the first buffer space 232a for supplying gases to a peripheral of the wafer 200 and the second buffer space 232b for supplying gases to a central portion of the wafer 200. Here, the total area of the through holes 236a which communicate with the first buffer space 232a (a gas area of the peripheral portion of the wafer 200) is preferably equal to the total area of the through holes 236b which communicate with the second buffer space 232b (a gas area of the central portion of the wafer 200). Also, a diameter of the through hole 236a is preferably greater than a diameter of the through hole 236b. Also, an area of the dispersion plate 234 disposed in the first buffer space 232a may be equal to an area of the dispersion plate 234 disposed in the second buffer space 232b.

The gas guide 240a has a conic shape having the first gas introduction port 231a as an apex, and the diameter of the gas guide 240a increases toward the dispersion plate 234. The gas guide 240b has a conic shape having the gas introduction port 231b as an apex, and the diameter of the gas guide 240b increases toward the dispersion plate 234.

That is, the buffer space 232 has a dual conic structure in which the second buffer space 232b is installed as a concentric circle inside the first buffer space 232a and a diameter of each of the first and second buffer spaces 232a and 232b increases toward the dispersion plate 234. Thus, the process gas supplied into the first and second buffer spaces 232a and 232b through the gas introduction ports 231a and 232b may smoothly flow, thereby uniformizing a flow rate of the process gas.

The first buffer space 232a is a space obtained by subtracting a space of the gas guide 240b (the second buffer space 232b) forming an conic shape from a space of the gas guide 240a forming an conic shape. In other words, a shape of the first buffer space 232a could be said that it forms a hollow conic shape (or a frustum of a cone shape) or a funnel shape, and, for convenience, is just described a conic shape herein.

Next, construction of a gas supply system connected to the above-described gas introduction port 231 will be described.

Source Gas Supply System

A source gas supply pipe 304 for supplying a source gas which is a first process gas is connected to the first gas introduction pipe 229a. Also, a source gas supply pipe 308 is connected to the second gas introduction pipe 229b. A mass flow controller (MFC) 404 which is a flow rate control device for controlling supply flow rates of gases from an upstream side and a valve 244 for controlling the supply of gases are installed at the source gas supply pipe 304. An MFC 408 and a valve 248 are installed at the source gas supply pipe 308 from an upstream side. For example, titanium tetrachloride (TiCl4) gas is used as the source gas which is the first process gas and supplied from the source gas supply pipes 304 and 308.

Reactive Gas Supply System

A reactive gas supply pipe 305 for supplying a reactive gas which is a second process gas is connected to the first gas introduction pipe 229a. A reactive gas supply pipe 309 is connected to the second gas introduction pipe 229b. An MFC 405 and a valve 245 are installed at the reactive gas supply pipe 305 from an upstream side. An MFC 409 and a valve 249 are installed at the reactive gas supply pipe 309 from an upstream side. For example, ammonia (NH3) gas is used as the reactive gas which is the second process gas and supplied from the reactive gas supply pipes 305 and 309.

Purge Gas Supply System

A purge gas supply pipe 306 for supplying a purge gas which is an inert gas is connected to the source gas supply pipe 304 at a downstream side of the valve 244. Also, a purge gas supply pipe 307 is connected to the reactive gas supply pipe 305 at a downstream side of the valve 245. A purge gas supply pipe 310 is connected to the source gas supply pipe 308 at a downstream side of the valve 248. Also, a purge gas supply pipe 311 is connected to the reactive gas supply pipe 309 at a downstream side of the valve 249.

MFCs 406, 407, 410, and 411 and valves 246, 247, 250, and 251 are installed at the purge gas supply pipes 306, 307, 310, and 311 from upstream sides, respectively. For example, nitrogen (N2) gas is used as the purge gas which is an inert gas and supplied to the purge gas supply pipes 306, 307, 310, and 311. In addition to N2 gas, a rare gas, such as helium (He) gas, neon (Ne) gas, argon (Ar) gas, etc., may be used as the purge gas.

Figure 5:
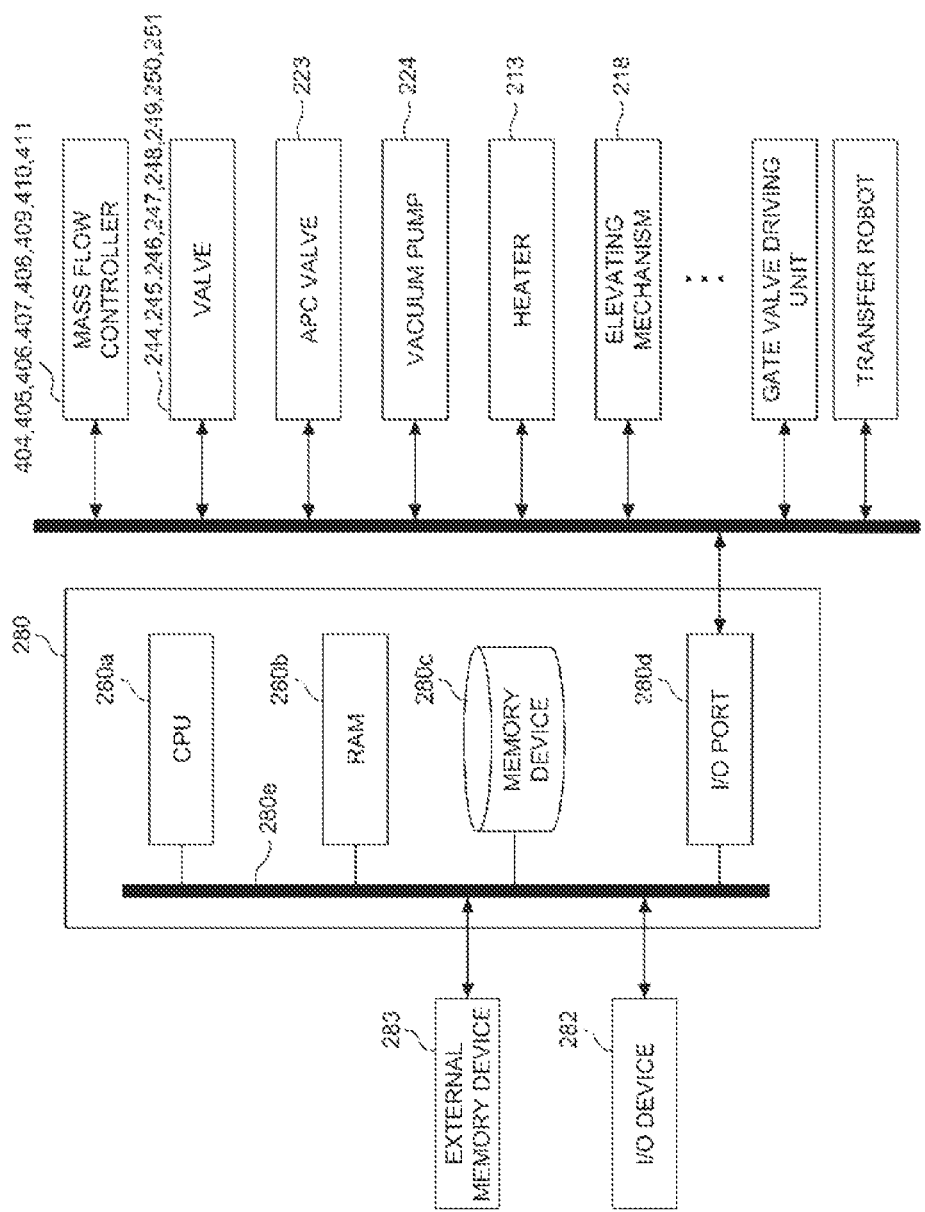
FIG. 5 is a block diagram of a hardware configuration of a control unit used in a substrate processing apparatus according to an exemplary embodiment of the present invention.

FIG. 5 illustrates a controller 280 which is a control unit. The controller 280 is configured as, for example, a computer including a central processing unit (CPU) 280a, a random access memory (RAM) 280b, a memory device 280c, and an input/output (I/O) port 280d. The RAM 280b, the memory device 280c, and the I/O port 280d are configured to exchange data with the CPU 280a via an internal bus 280e. An I/O device 282 configured, for example, as a touch panel or the like is connected to the controller 280.

The memory device 280c is configured, for example, as a flash memory, a hard disk drive (HDD), or the like. In the memory device 280c, a control program for controlling an operation of a substrate processing apparatus or a process recipe including an order or conditions of substrate processing which will be described below is stored to be readable. The process recipe is a combination of sequences of a substrate processing process which will be described below to obtain a desired result performed by the controller 280, and acts as a program. Hereinafter, the process recipe, the control program, etc. will also be referred to together simply as a 'program.' Also, when the term 'program' is used in the present disclosure, it should be understood as including only a process recipe, only a control program, or both of the a process recipe and the control program. The RAM 280b is configured as a memory area (work area) in which a program or data read by the CPU 280a is temporarily stored.

The I/O port 280d is connected to the MFCs 404, 405, 406, 407, 408, 409, 410, and 411, the valves 244, 245, 246, 247, 248, 249, 250, and 251, the APC valve 223, the vacuum pump 224, the heater 213, the elevating mechanism 218, etc. which are described above.

The CPU 280a is configured to read and execute the control program from the memory device 280c and to read the process recipe from the memory device 280c according to a manipulation command received via the I/O device 282. Also, according to the read process recipe, the CPU 280a is configured to control flow rates of various gases via the MFCs 404, 405, 406, 407, 408, 409, 410, and 411, control opening/closing of the valves 244, 245, 246, 247, 248, 249, 250, and 251, control the degree of pressure using the APC valve 223, control temperature using the heater 213 based on a temperature sensor (not shown), control starting/stopping of the vacuum pump 224, control upward/downward movement, rotation, and a rotation rate of the shaft 217 using the elevating mechanism 218, etc.

The controller 280 is not limited to a dedicated computer and may be configured as a general-purpose computer. For example, the controller 280 according to the present embodiment may be configured by preparing an external memory device 283 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device 283. Also, units for supplying a program to a computer are not limited to using the external memory device 283. For example, a program may be supplied to a computer using communication units, e.g., the Internet or an exclusive line, without using the external memory device 283. The memory device 280c or the external memory device 283 may be configured as a non-transitory computer-readable recording medium. Hereinafter, the memory device 280c and the external memory device 283 may also be referred to as simply a 'recording medium.' Also, when the term 'recording medium' is used in the present disclosure, it may be understood as only the memory device 280c, only the external memory device 283, or both the memory device 280c and the external memory device 283.

Figure 6:
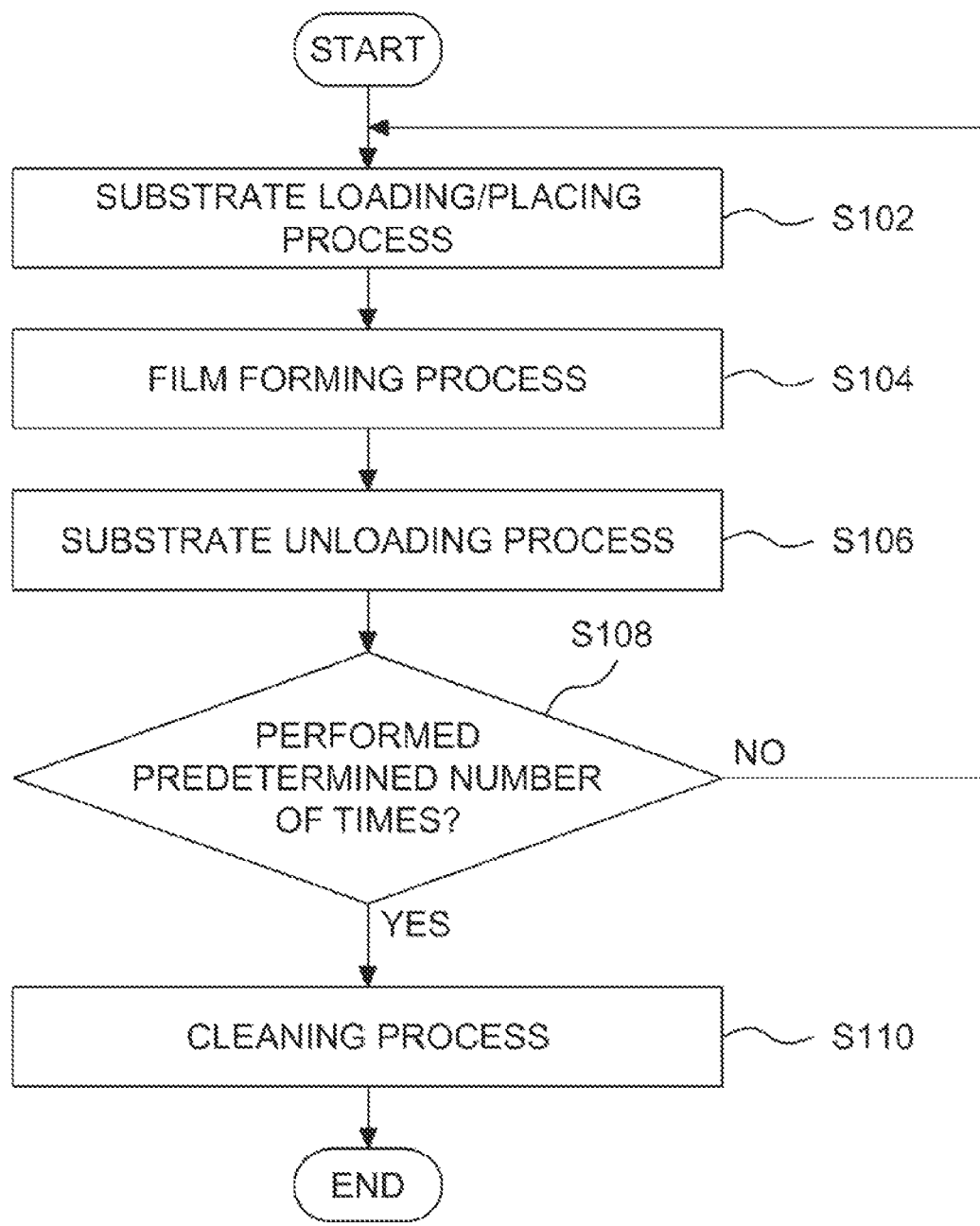
FIG. 6 is a flowchart illustrating a substrate processing process according to an exemplary embodiment of the present invention.

Next, an example in which a substrate processing process is performed as one of the processes for manufacturing a semiconductor device (device) using the above-described substrate processing apparatus 100 will be described. In the following description, an operation of each of the constitutional elements of the substrate processing apparatus 100 is controlled by the controller 280. FIG. 6 is a flowchart illustrating a substrate processing process according to an exemplary embodiment of the present invention.

Substrate Loading/Placing Process, Step S102

To begin with, the transfer chamber (not shown) is allowed to communicate with the transfer space 203 by opening the gate valve 205. Next, a wafer 200 which is a processing target is loaded into the transfer space 203 by a transfer robot (not shown) through the transfer chamber. The wafer 200 loaded into the transfer space 203 is placed by the transfer robot on the substrate placing table 212 moved downward to the position of the substrate loading/unloading port 206, and moved upward to the substrate process position. Next, when the transfer robot returns to the inside of the transfer chamber through the transfer space 203, the gate valve 205 is closed.

Film Forming Process, Step S104

Next, a film forming process (step S104) to be described below is performed.

Substrate Unloading Process, Step S106

When the film forming process [step S104] ends, the wafer 200 on which a film is formed is unloaded into the transfer chamber through the transfer space 203 in reverse order to the order described in the above-described substrate loading/placing process [step S102].

Step S108

As described above, films are formed on a predetermined number of wafers 200 by performing a cycle including steps S102 through S106 a predetermined number of times.

Cleaning Process, Step S110

When a series of processing processes is ended, the valves 246, 247, 250, and 251 are opened, and N2 gas is supplied into the process space 201 via the first gas introduction pipe 229a, the second gas introduction pipe 229b, the first buffer space 232a and the second buffer space 232b. In this case, the process space 201 is vacuum-exhausted by the vacuum pump 224 with the APC valve 223 of the exhaust pipe 222 in an open state. Thus, any remaining gases or byproducts are removed from the process space 201 and the transfer space 203.

Hereinafter, an example in which a titanium nitride (TiN) film is formed on the wafer 200 in the film forming process [step S104] will be described.

First Embodiment

Figure 7:
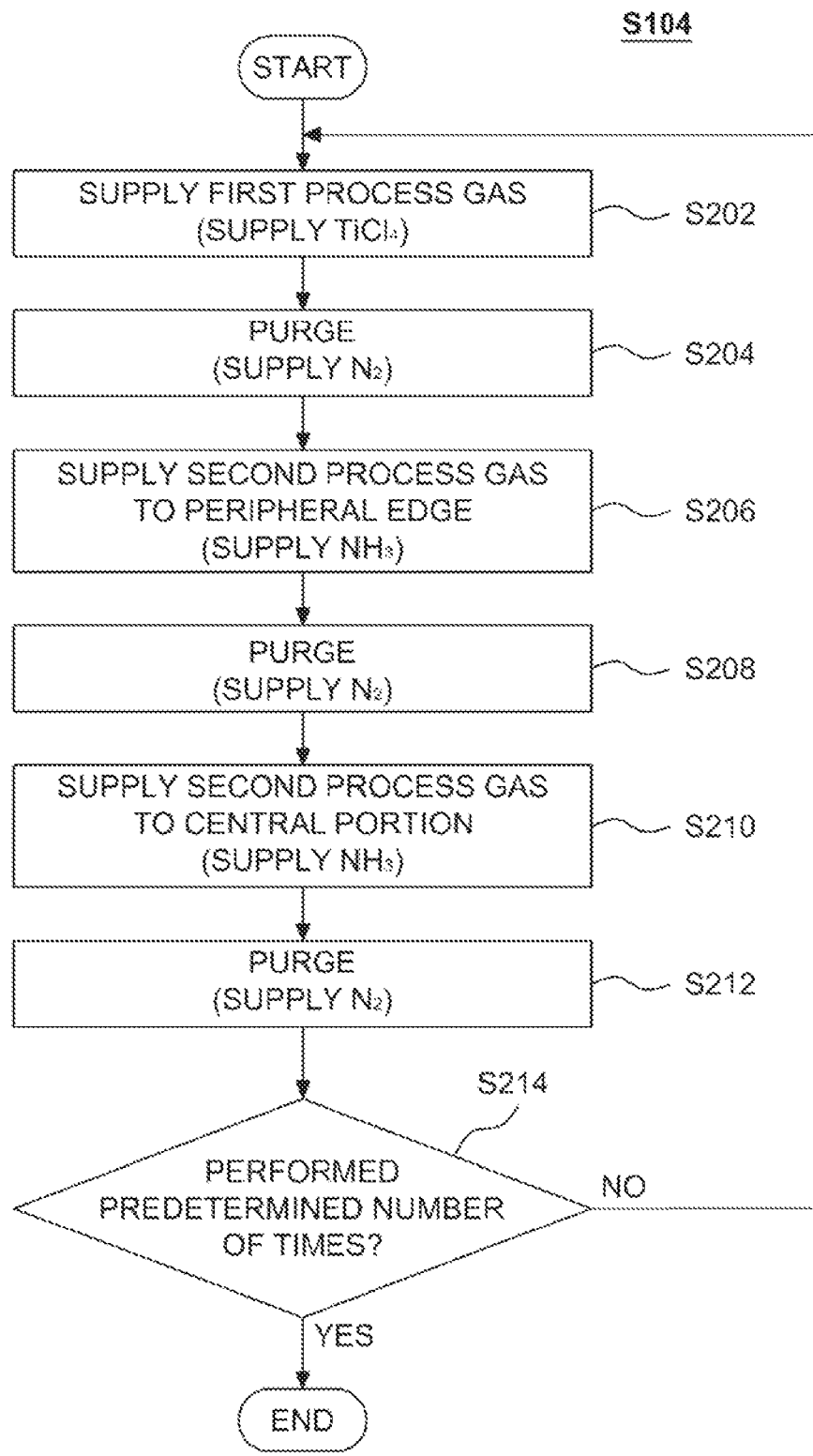
FIG. 7 is a flowchart illustrating a film forming process according to first and second exemplary embodiments of the present invention.
Figure 8:
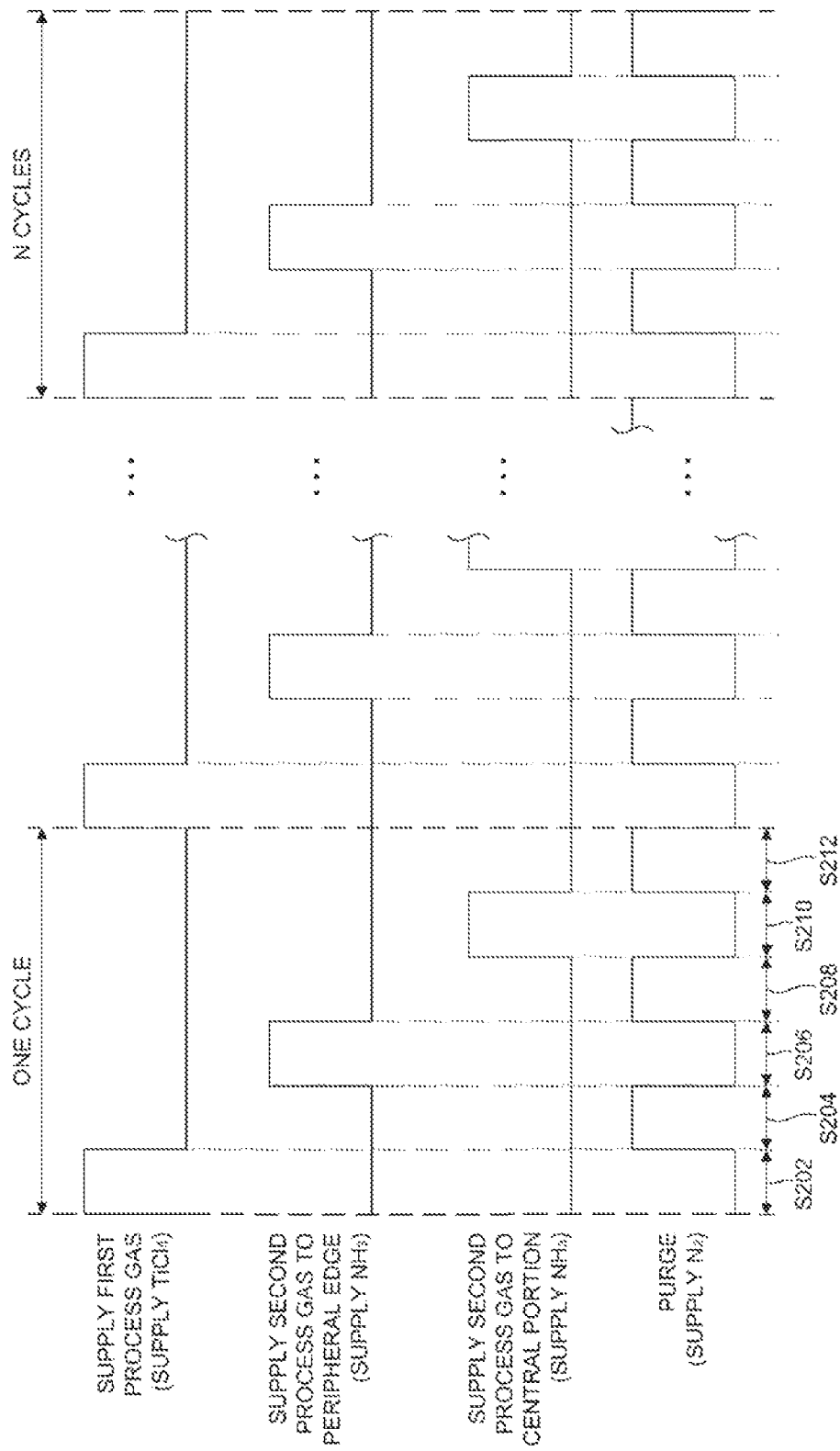
FIG. 8 is a timing chart illustrating gas supply timing in a film forming process according to a first exemplary embodiment of the present invention.

FIG. 7 is a flowchart illustrating a film forming process of forming a TiN film according to a first embodiment of the present invention. FIG. 8 is a timing chart illustrating gas supply timing in a TiN film forming process according to the first exemplary embodiment of the present invention. FIGS. 12A through 12E are schematic diagrams illustrating aspects of a surface of a wafer in a TiN film forming process according to an exemplary embodiment of the present invention.

Supply $TiCl_4$ Gas, Step S202

The valve 244 and the valve 248 are opened, and TiCl4 gas is supplied into the first gas introduction pipe 229a and the second gas introduction pipe 229b. Flow rates of the TiCl4 gas supplied into the first gas introduction pipe 229a and the second gas introduction pipe 229b are adjusted by the MFCs 404 and 408, respectively. The TiCl4 gas, the flow rates of which are adjusted, is supplied through the first gas introduction port 231a and the second gas introduction port 231b into the first buffer space 232a and the second buffer space 232b, respectively, supplied into the process space 201 via the through holes 236a and 236b of the dispersion plate 234, and exhausted through the exhaust pipe 222 via the exhaust port 221. That is, the TiCl4 gas is supplied onto the wafer 200 so that the surface of the wafer 200 may be exposed to the TiCl4 gas.

Figure 12A:
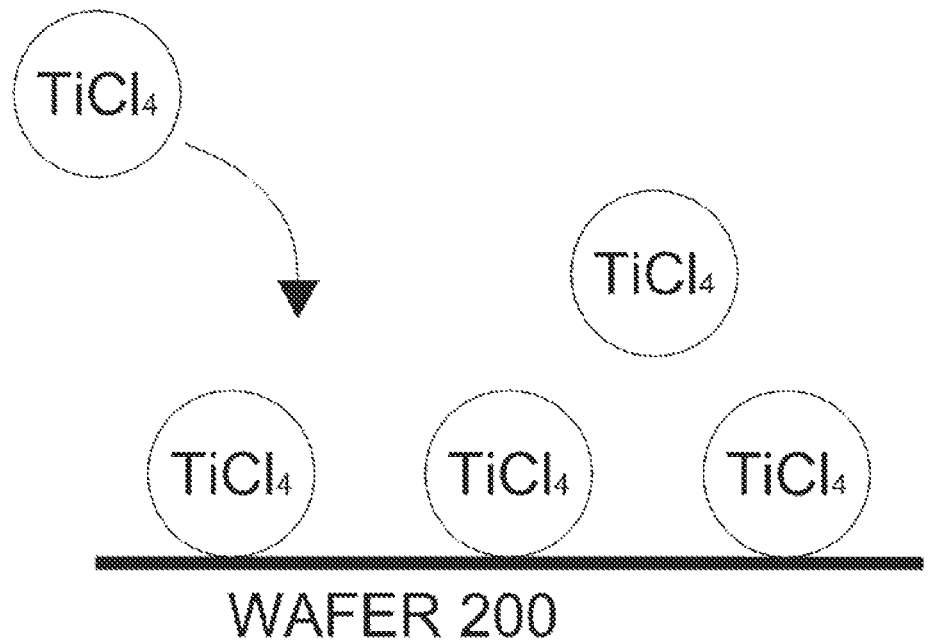
FIGS. 12A through 12E are schematic diagrams illustrating aspects of a surface of a wafer in a film forming process according to an exemplary embodiment of the present invention.
Figure 12B:
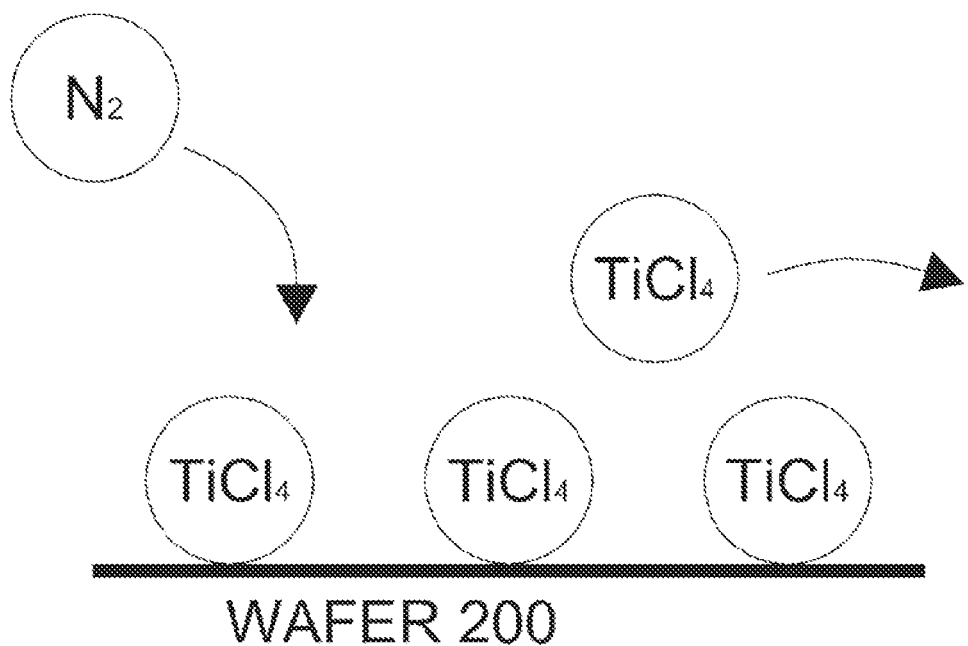
Figure 12C:
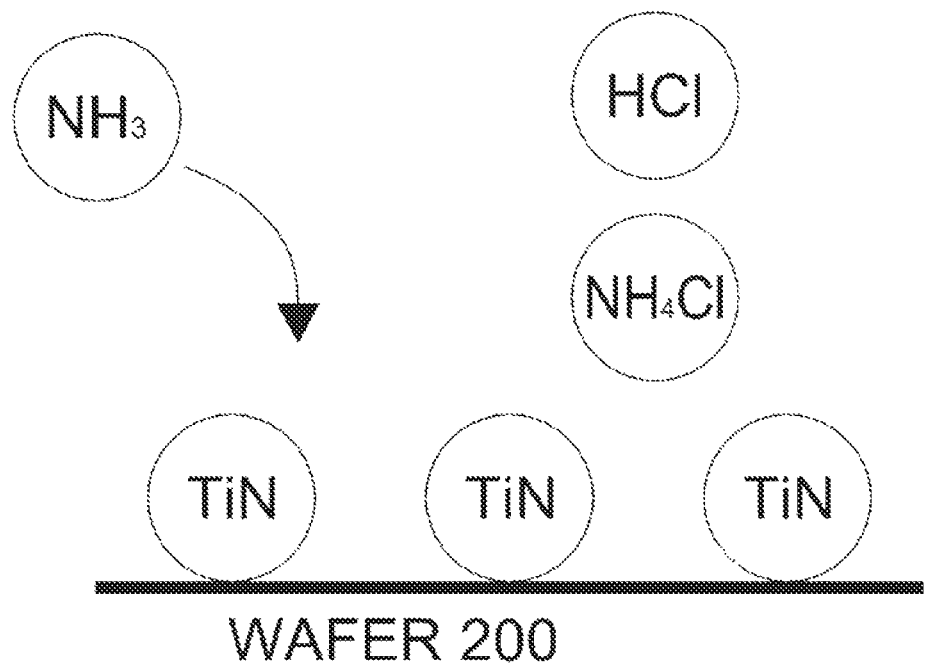
Figure 12D:
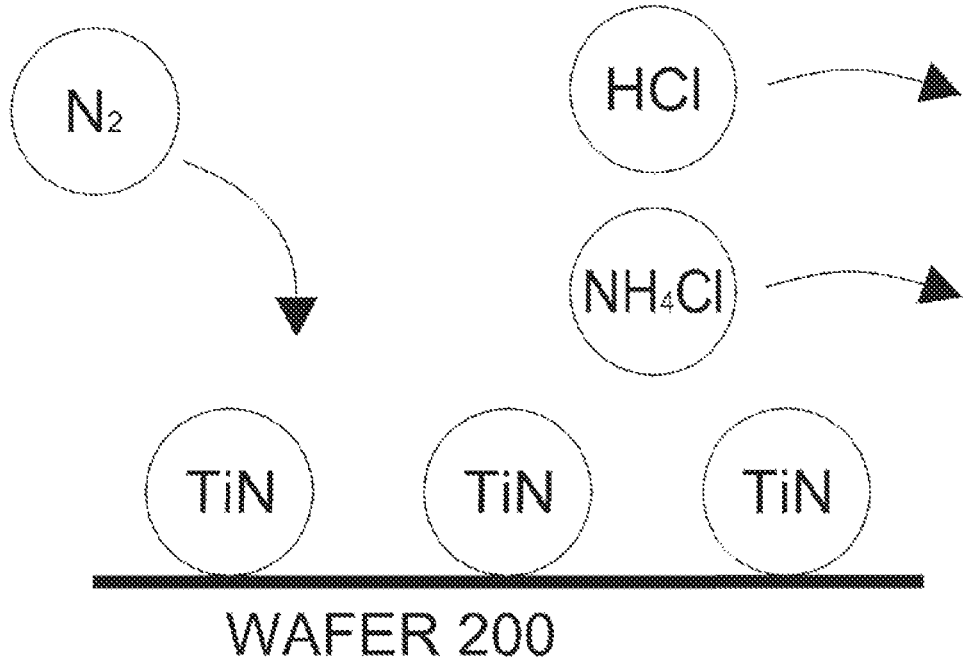

By supplying the TiCl4 gas, a titanium (Ti)-containing layer is formed on the wafer 200 (refer to FIG. 12A).

Purge, Step S204

After the titanium-containing layer is formed on the wafer 200, the valve 244 and the valve 248 are closed to stop the supply of the TiCl4 gas. Also, the valves 246 and 250 of the purge gas supply pipes 306 and 310 are opened, and N2 gas is supplied into the process space 201 via the first gas introduction pipe 229a, the second gas introduction pipe 229b, the first buffer space 232a, and the second buffer space 232b. Flow rates of the N2 gas supplied into the purge gas supply pipes 306 and 310 are adjusted by the MFCs 406 and 410, respectively. The N2 gas, flow rates of which are adjusted, functions as a purge gas, and any TiCl4 gas (that did not react or that has contributed to the formation of the titanium-containing layer) remaining in the first gas introduction pipe 229a, the second gas introduction pipe 229b, the first buffer space 232a, the second buffer space 232b, and the process space 201 is eliminated from the first gas introduction pipe 229a, the second gas introduction pipe 229b, the first buffer space 232a, the second buffer space 232b, and the process space 201 (refer to 12B). In this case, the inside of the process space 201 is vacuum-exhausted by the vacuum pump 224 with the APC valve 223 of the exhaust pipe 222 in an open state.

In addition, N2 gas may be supplied into the first gas introduction pipe 229a, the second gas introduction pipe 229b, the first buffer space 232a, the second buffer space 232b, and the process space 201 by opening not only the valves 246 and 250 but by opening valves of all the purge gas supply pipes, namely, the valves 246, 247, 250, and 251. Thus, a backflow of the process gas is prevented.

Supply NH3 Gas (Peripheral Portion), Step S206>

After step S204 is ended, and the residual gas is removed from the process space 201, the valves 246 and 250 are closed and the valve 245 is opened, so that NH3 gas may be supplied into the reactive gas supply pipe 305. A flow rate of the NH3 gas supplied into the reactive gas supply pipe 305 is adjusted by the MFC 405. The NH3 gas, the flow rate of which is adjusted, is supplied through the first gas introduction pipe 229a into the first buffer space 232a, supplied via the through holes 236a of the peripheral portion of the dispersion plate 234 into the process space 201, and exhausted through the exhaust pipe 222. In this case, NH3 gas is supplied onto the peripheral portion of the wafer 200. That is, the surface of the peripheral portion of the wafer 200 is exposed to the NH3 gas.

By supplying NH3 gas onto the peripheral portion of the wafer 200, the titanium-containing layer formed on the wafer 200 in the peripheral portion of the wafer 200 reacts with the NH3 gas. In this case, the titanium-containing layer formed on the wafer 200 in the peripheral portion of the wafer 200 is mainly nitrided and modified into a titanium nitride (TiN) layer (refer to FIG. 12C).

Purge, Step S208

Afterwards, the valve 245 of the reactive gas supply pipe 305 is closed to stop the supply of the NH3 gas into the first gas introduction pipe 229a. Also, the valve 247 of the purge gas supply pipe 307 is opened to supply N2 gas via the first gas introduction pipe 229a and the first buffer space 232a into the process space 201. A flow rate of the N2 gas supplied into the purge gas supply pipe 307 is adjusted by the MFC 407. The N2 gas, the flow rate of which is adjusted, functions as a purge gas, and any NH3 gas (that did not react or that has contributed to the formation of the TiN layer) or reaction byproducts, such as hydrogen chloride (HCl) or ammonium chloride (NH4Cl) gas, which remain in the first gas introduction pipe 229a, the first buffer space 232a, and the process space 201, are eliminated from the first gas introduction pipe 229a, the first buffer space 232a, and the process space 201 (refer to FIG. 12d). In this case, the inside of the process space 201 is vacuum-exhausted by the vacuum pump 224 with the APC valve 223 of the exhaust pipe 222 in an open state.

In addition, N2 gas may be supplied into the first gas introduction pipe 229a, the second gas introduction pipe 229b, the first buffer space 232a, the second buffer space 232b, and the process space 201 by opening not only the valve 247 but by opening valves of all the purge gas supply pipes, namely, the valves 246, 247, 250, and 251. Thus, backflows of the process gases or reaction byproducts are prevented.

Supply NH3 Gas (Central Portion), Step S210

After step S208 is ended and the residual gas is removed from the inside of the process space 201, the valve 247 is closed and the valve 249 is opened to supply NH3 gas into the reactive gas supply pipe 309. A flow rate of the NH3 gas supplied into the reactive gas supply pipe 309 is adjusted by the MFC 409. The NH3 gas, the flow rate of which is adjusted, is supplied through the second gas introduction pipe 229b into the second buffer space 242b, supplied through the through holes 236b of a central portion of the dispersion plate 234 into the process space 201, and exhausted through the exhaust pipe 222. In this case, NH3 gas is supplied onto the central portion of the wafer 200. That is, the surface of the central portion of the wafer 200 is exposed to the NH3 gas.

By supplying the NH3 gas onto the central portion of the wafer 200, the titanium-containing layer formed on the wafer 200 in the central portion of the wafer 200 reacts with the NH3 gas. In this case, the titanium-containing layer formed on the wafer 200 in the central portion of the wafer 200 is mainly nitrided and modified into a titanium nitride (TiN) layer (refer to FIG. 12C).

Purge, Step S212

Afterwards, the valve 249 of the reactive gas supply pipe 309 is closed to stop the supply of NH3 gas into the second gas introduction pipe 229b. Also, the valve 251 of the purge gas supply pipe 311 is opened to supply N2 gas via the second gas introduction pipe 229b and the second buffer space 232b into the process space 201. A flow rate of the N2 gas supplied into the purge gas supply pipe 311 is adjusted by the MFC 411. The N2 gas, the flow rate of which is adjusted, functions as a purge gas, and any NH3 gas (that did not react or that has contributed to the formation of the TiN layer) or reaction byproducts, such as hydrogen chloride (HCl) or ammonium chloride (NH4Cl) gas, which remain in the second gas introduction pipe 229b, the second buffer space 232b, and the process space 201, are eliminated from the second gas introduction pipe 229b, the second buffer space 232b, and the process space 201 (refer to 12D). In this case, the inside of the process space 201 is vacuum-exhausted by the vacuum pump 224 with the APC valve 223 of the exhaust pipe 222 in an open state.

In addition, the N2 gas may be supplied into the first gas introduction pipe 229a, the second gas introduction pipe 229b, the first buffer space 232a, the second buffer space 232b, and the process space 201 by opening not only the valve 251 but by opening valves of all the purge gas supply pipes, namely, the valves 246, 247, 250, and 251. Thus, backflows of the process gases are prevented.

Step S214

Thereafter, a TiN film having a predetermined film thickness is formed by performing a set including the above-described steps S202 to S212 a predetermined number of times. The set is preferably performed a plurality of times rather than performed once.

Second Embodiment

Figure 9:
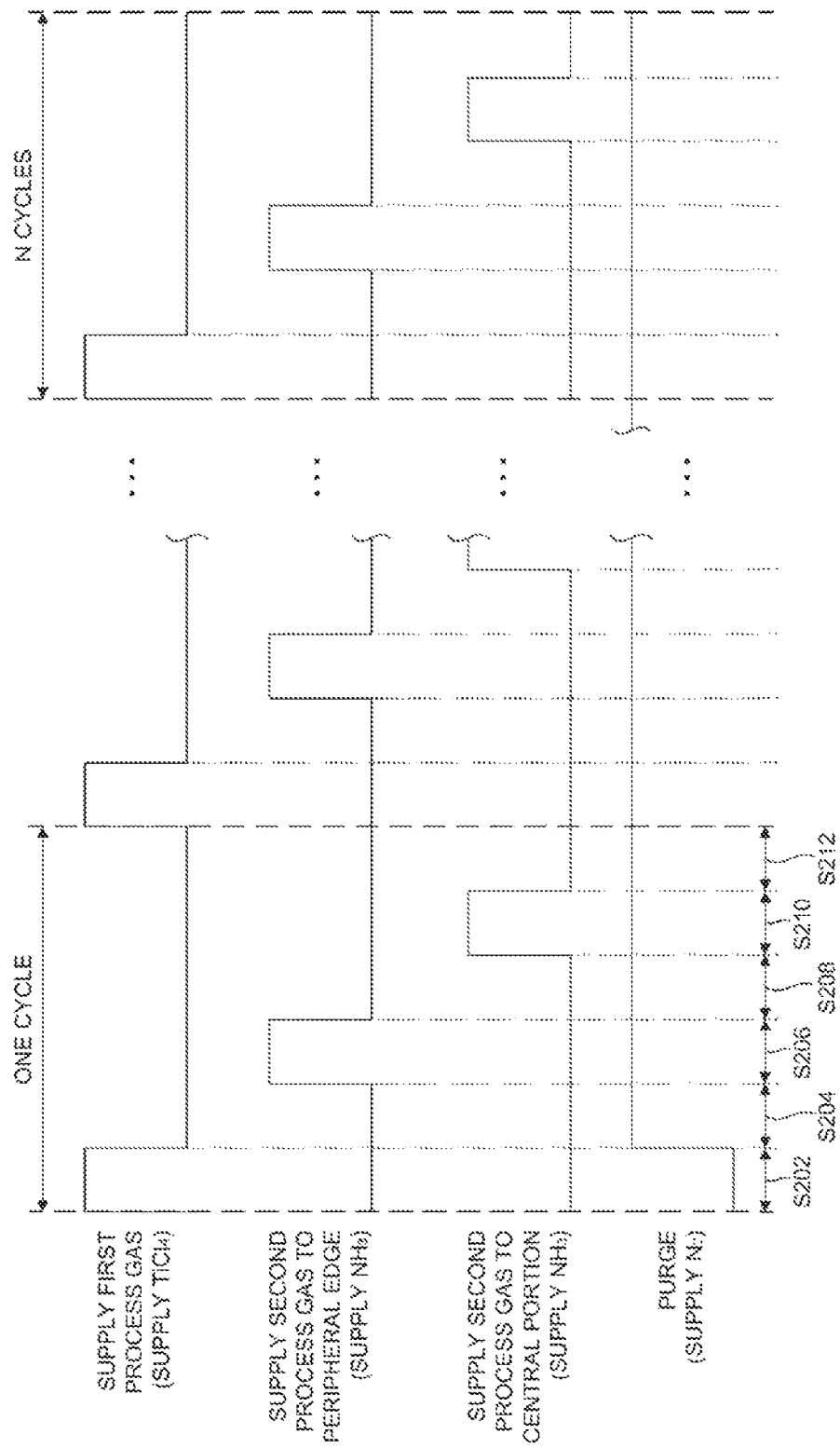
FIG. 9 is a timing chart illustrating gas supply timing in a film forming process according to a second exemplary embodiment of the present invention.

FIG. 9 is a timing chart illustrating gas supply timing in a TiN film forming process according to a second exemplary embodiment of the present invention. A flow of a TiN film forming process according to the present embodiment differs from a flow of a TiN film forming process according to the first embodiment only in terms of timing in the supply of N2 gas.

In the present embodiment, the TiCl4 gas supply process [step S202], the purge process [step S204], the NH3 gas supply process of supplying NH3 gas onto a peripheral portion of a wafer [step S206], the purge process [step S208], the NH3 gas supply process of supplying NH3 gas onto a central portion of the wafer [step S210], and the purge process [step S212] according to the first embodiment described above are performed. During each of the steps S202 through step S212, the valves 246, 247, 250, and 251 of the purge gas supply pipes 306, 307, 310, and 311 are opened, and N2 gas (purge gas) is continuously supplied into the first gas introduction pipe 229a, the second gas introduction pipe 229b, the first buffer space 232a, the second buffer space 232b, and the process space 201. Flow rates of N2 gas supplied into the purge gas supply pipes 306, 307, 310, and 311 are adjusted by the MFCs 406, 407, 410, and 411, respectively. Thus, backflows of process gases or reaction byproducts are prevented.

Third Embodiment

Figure 10:
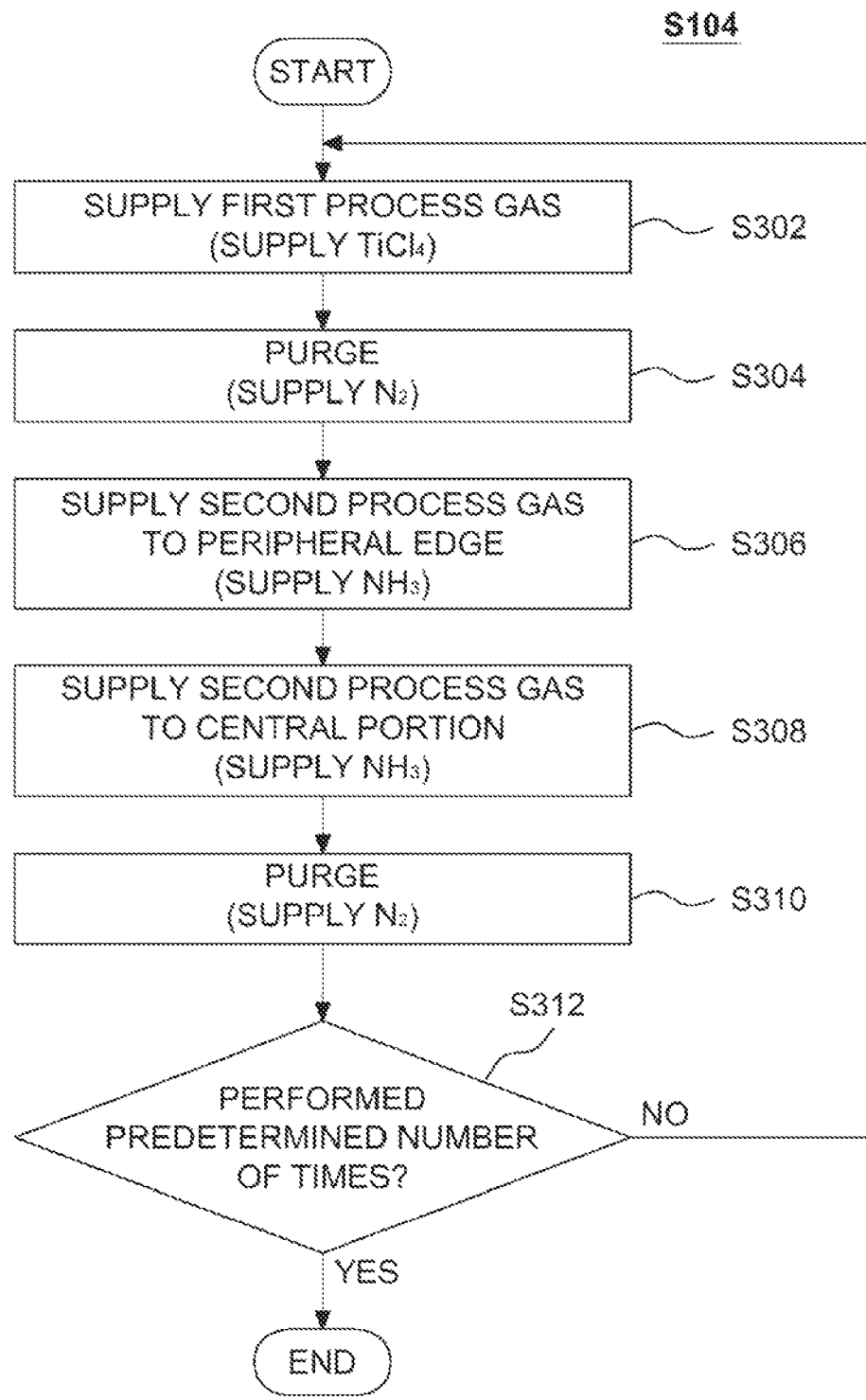
FIG. 10 is a flowchart illustrating a film forming process according to a third exemplary embodiment of the present invention.

FIG. 10 is a flowchart illustrating a TiN film forming process according to a third exemplary embodiment of the present invention. FIG. 11 is a timing chart illustrating gas supply timing in a TiN film forming process according to a third exemplary embodiment of the present invention.

Supply TiCl$_4$ Gas, Step S302

The valve 244 and the valve 248 are opened to supply TiCl4 gas into the first gas introduction pipe 229a and the second gas introduction pipe 229b. Flow rates of the TiCl4 gas supplied into the first gas introduction pipe 229a and the second gas introduction pipe 229b are respectively adjusted by the MFCs 404 and 408. The TiCl4 gas, the flow rate of which is adjusted, is supplied through the first gas introduction port 231a and the second gas introduction port 231b into the first buffer space 232a and the second buffer space 232b, respectively, supplied via the through holes 236a and 236b of the dispersion plate 234, and exhausted via the exhaust port 221 through the exhaust pipe 222. That is, the TiCl4 gas is supplied onto the wafer 200 so that the surface of the wafer 200 may be exposed to the TiCl4 gas.

A titanium-containing layer is formed on the wafer 200 by supplying the TiCl4 gas (refer to FIG. 12A).

Purge, Step S304

After forming the titanium-containing layer on the wafer 200, the valve 244 and the valve 248 are closed to stop the supply of the TiCl4 gas. Also, the valves 246 and 250 of the purge gas supply pipes 306 and 310 are opened to supply N2 purge gas via the first gas introduction pipe 229a, the second gas introduction pipe 229b, the first buffer space 232a, and the second buffer space 232b into the process space 201. Flow rates of the N2 gas supplied into the purge gas supply pipes 306 and 310 are adjusted by the MFCs 406 and 410, respectively. The N2 gas, the flow rate of which is adjusted, functions as a purge gas, and any TiCl4 gas (that did not react or that has contributed to the formation of the titanium-containing layer) remaining in the first gas introduction pipe 229a, the second gas introduction pipe 229b, the first buffer space 232a, the second buffer space 232b, and the process space 201 is eliminated from the first gas introduction pipe 229a, the second gas introduction pipe 229b, the first buffer space 232a, the second buffer space 232b, and the process space 201 (refer to FIG. 12B). In this case, the inside of the process space 201 is vacuum-exhausted by the vacuum pump 224 with the APC valve 223 of the exhaust pipe 222 in an open state.

Supply NH3 Gas (Peripheral Portion), Step S306

After step S304 ends and the residual gas is removed from the inside of the process space 201, the valves 246 and 250 are closed and the valve 245 is opened to supply NH3 gas into the reactive gas supply pipe 305. A flow rate of the NH3 gas supplied into the reactive gas supply pipe 305 is adjusted by the MFC 405. The NH3 gas, the flow rate of which is adjusted, is supplied through the first gas introduction pipe 229a into the first buffer space 232a, supplied through the through holes 236a of the peripheral portion of the dispersion plate 234 into the process space 201, and exhausted through the exhaust pipe 222. In this case, the NH3 gas is supplied onto the peripheral portion of the wafer 200. That is, the surface of the peripheral portion of the wafer 200 is exposed to the NH3 gas.

By supplying the NN3 gas onto the peripheral portion of the wafer 200, the titanium-containing layer formed on the wafer 200 in the peripheral portion of the wafer 200 reacts with the NH3 gas. In this case, the titanium-containing layer formed on the wafer 200 in the peripheral portion of the wafer 200 is mainly nitrided and modified into a titanium nitride (TiN) layer (refer to FIG. 12C).

Supply NH3 Gas (Central Portion), Step S308

Afterwards, the valve 245 of the reactive gas supply pipe 305 is closed to stop the supply of the NH3 gas into the first gas introduction pipe 229a. Next, the valve 249 is opened to supply NH3 gas into the reactive gas supply pipe 309. A flow rate of the NH3 gas supplied into the reactive gas supply pipe 309 is adjusted by the MFC 409. The NH3 gas, the flow rate of which is adjusted, is supplied via the second gas introduction pipe 229b and the second buffer space 242b through the through holes 236b of the central portion of the dispersion plate 234 into the process space 201, and exhausted through the exhaust pipe 222. In this case, the NH3 gas is supplied onto the central portion of the wafer 200. That is, the surface of the central portion of the wafer 200 is exposed to the NH3 gas.

By supplying the NH3 gas onto the central portion of the wafer 200, the titanium-containing layer formed on the wafer 200 in the central portion of the wafer 200 reacts with the NH3 gas. In this case, the titanium-containing layer formed on the wafer 200 in the central portion of the wafer 200 is mainly nitrided and modified into a titanium nitride (TiN) layer (refer to FIG. 12C).

Purge, Step S310

Afterwards, the valve 249 is closed to stop the supply of the NH3 gas into the second gas introduction pipe 229b. Also, the valves 247 and 251 of the purge gas supply pipes 307 and 311 are opened to supply N2 gas via the first gas introduction pipe 229a, the second gas introduction pipe 229b, the first buffer space 232a, and the second buffer space 232b into the process space 201. Flow rates of the N2 gas supplied into the purge gas supply pipes 307 and 311 are adjusted by the MFCs 407 and 411, respectively. The N2 gas, the flow rate of which is adjusted, functions as a purge gas, and any NH3 gas (that did not react or that has contributed to the formation of the TiN layer) or reaction byproducts, such as hydrogen chloride (HCl) or ammonium chloride (NH4Cl) gas, which remain in the first gas introduction pipe 229a, the second gas introduction pipe 229b, the first buffer space 232a, the second buffer port 232b, and the process space 201, are eliminated from the first gas introduction pipe 229a, the second gas introduction pipe 229b, the first buffer space 232a, the second buffer space 232b, and the process space 201 (refer to FIG. 12D). In this case, the inside of the process space 201 is vacuum-exhausted by the vacuum pump 224 with the APC valve 223 of the exhaust pipe 222 in an open state.

Step S312

Thereafter, a TiN film having a predetermined film thickness is formed by performing a set including the above-described steps S302 to S310 a predetermined number of times. The set is preferably performed a plurality of times rather than performed once.

In the third embodiment, N2 gas (purge gas) may be continuously supplied during each of processes [steps S302 through S310]. Thus, backflows of the process gases or reaction byproducts are prevented.

Figure 12E:

FIG. 12A illustrates an example in which a titanium-containing layer is formed on the wafer 200 without gaps and the wafer 200 is in a saturated ALD state. Meanwhile, FIG. 12E illustrates an example in which a gap occurs in the titanium-containing layer on the wafer 200, a film having a thickness of less than one atomic layer is formed, and the wafer 200 is in an unsaturated ALD state. After the titanium-containing layers are formed, when a purge process is performed (refer to FIG. 12B) and a reactive gas is supplied to the surface of the wafer 200 (refer to FIG. 12C), reaction byproducts, such as hydrogen chloride (HCl) or ammonium chloride (NH4Cl) gas (that did not react or that has contributed to the formation of the TiN layer) remain in the process space 201. The NH4Cl gas may serve as a reaction inhibiting factor and be adhered to the surface of the wafer 200 which is in the unsaturated state as shown in FIG. 12E.

In a single-wafer-type apparatus including one buffer space, which is a conventional apparatus, since a reactive gas uniformly flowing out through a shower head flows directly from under the shower head onto a surface of a wafer toward an exhaust port of an outer circumferential unit of the wafer, a reactive gas flowing out through a central portion of the shower head flows a distance different from a distance by which a reactive gas flowing out through the outer circumferential unit of the shower head flows on the surface of the wafer. Due to the difference in distance, for example, when a probability of a reaction of the reactive gas is low, a film thickness in the central portion of the wafer becomes different from a film thickness in a peripheral portion of the wafer. Also, when a reactive gas is exposed to a high temperature on the surface of the wafer for a predetermined amount of time or more, an unintentional reaction occurs on the wafer or the reactive gas decomposes to generate unexpected reaction byproducts, thereby producing adverse effects (e.g. inhibition to reactions).

In the present embodiment, after a reactive gas is supplied to a peripheral portion of a wafer, a reactive gas is supplied to a central portion of the wafer such that time points at which the reactive gases are supplied do not overlap. That is, by supplying the reactive gas to the peripheral portion of the wafer and bringing the peripheral portion of the wafer into a saturated ALD state before the central portion of the wafer, reaction byproducts may be removed using a subsequent purge process (refer to FIG. 12D). Thus, materials serving as reaction inhibiting factors may be prevented from being adhered to the surface of the peripheral portion of the wafer which is liable to be in an unsaturated ALD state.

That is, by supplying a reactive gas from the peripheral portion of the wafer to the central portion thereof, a reaction inhibiting material may be generated due to the supply of a process gas from an outer side near an exhaust unit, thereby reducing a substrate processing time and improving film quality.

For example, when a film thickness or film quality is uniformized by supplying a larger amount of NH3 gas serving as a reactive gas to the peripheral portion of the wafer than the central portion thereof, a supply amount of NH3 gas supplied through the first gas introduction pipe 229a disposed at an outer side may be increased more than a supply amount of NH3 gas supplied through the second gas introduction pipe 229b disposed at an inner side.

For example, when the film thickness or film quality is uniformized by supplying NH3 gas serving as the reactive gas to the peripheral portion of the wafer faster than to the central portion thereof, NH3 gas supplied through the first gas introduction pipe 229a disposed at the outer side may be supplied at a higher speed than NH3 gas supplied through the second gas introduction pipe 229b disposed at the inner side.

That is, in-plane uniformity of the wafer may be improved by dividing the buffer space 232 of the shower head 230 into a plurality of spaces and controlling gas supply amounts, gas ratios, or gas supply timings of the respective spaces.

Since it becomes possible to improve uniformity of film quality according to the present embodiment, a thin film may be formed with increased yield.

While the embodiments of the present invention have been described above in detail, the present invention is not limited thereto, and various changes may be made therein without departing from the spirit of the invention.

For example, although the previous embodiment has described an example in which TiCl4 gas is used as a source gas and NH3 gas is used as a reactive gas, the present invention is not limited thereto. A different gas species may be used or metal gases may be used as both the source gas and the reactive gas.

Although the previous embodiment has described a case in which a TiN film is formed as a high-k insulating film, the present invention is not limited thereto. That is, the present invention is preferably applicable to cases in which a hafnium oxide (HfO2) film, a titanium oxide (TiO2) film, a niobium oxide (Nb2O5) film, a tantalum oxide (Ta2O5) film, a strontium titanate (SrTiO) film, a barium strontium titanate (BaSrTiO) film, a lead zirconium titanate (PZT) film, or films obtained by adding other elements to the above-described films is used as the high-k insulating film.

Also, although the previous embodiment has described a case in which the buffer space 232 has the dual conic structure, the present invention is not limited thereto. The buffer space 232 may have an angular conic shape, such as a triangular conic shape or a tetragonal conic shape, or a dual cylindrical structure. Also, the previous embodiment has described a case in which the buffer space 232 has the dual conic structure, but the present invention is not limited thereto, and the buffer space 232 may be divided into a plurality of spaces. Also, the previous embodiment has specifically described an example in which the buffer space 232 is divided into two spaces, but the present invention is not limited thereto, and the buffer space 232 may be divided into three or more spaces. Furthermore, although the previous embodiment has described a structure in which the gas guide 240 is in contact with the dispersion plate 234, the present invention is not limited thereto, and a gap may be formed between the gas guide 240b and the dispersion plate 234.

The present invention may be applied not only to an ALD process, a cyclic CVD process, a pulse CVD process, and a metal organic CVD (MOCVD) process but also to a method (substrate processing method) of forming a film by causing a reaction between at least two types of process gases.

In a substrate processing apparatus, a method of processing a substrate and a method of manufacturing a semiconductor device according to the present invention, uniformity in an in-plane surface of a substrate can be improved by inhibiting generation of byproducts.

Exemplary Embodiments of the Present Invention

Exemplary embodiments of the present invention will be supplementarily described below.

Supplementary Note 1

According to one aspect of the present invention, there is provided a substrate processing apparatus including: a process chamber configured to process a substrate; a gas supply unit including gas supply holes configured to independently supply a process gas for processing the substrate to each of a central portion of the substrate and a peripheral portion of the substrate in the process chamber; an exhaust unit configured to exhaust an inside of the process chamber; and a control unit configured to control the gas supply unit to supply the process gas to the central portion of the substrate after the process gas is supplied to the peripheral portion of the substrate through the gas supply unit.

Supplementary Note 2

The substrate processing apparatus of Supplementary note 1, wherein the gas supply unit includes a shower head structure having an inner space divided into a first buffer space for supplying the process gas to the peripheral portion of the substrate and a second buffer space for supplying the process gas to the central portion of the substrate.

Supplementary Note 3

The substrate processing apparatus of Supplementary note 1 or 2, wherein the exhaust unit is installed at an outer side in a diametrical direction of the substrate.

Supplementary Note 4

The substrate processing apparatus of any one of Supplementary notes 1 through 3, wherein a first area of the peripheral portion of the substrate where the process gas is supplied by the gas supply unit is equal to a second area of the central portion of the substrate where the process gas is supplied by the gas supply unit.

Supplementary Note 5

The substrate processing apparatus of any one of Supplementary notes 2 through 4, wherein each of the first buffer space and the second buffer space has a conic shape.

Supplementary Note 6

The substrate processing apparatus of any one of Supplementary notes 1 through 5, wherein the gas supply holes comprise a first gas supply hole for supplying the process gas to the peripheral portion of the substrate and a second gas supply hole for supplying the process gas to the central portion of the substrate, and the first gas supply hole and the second gas supply hole are configured so that a diameter of the first gas supply hole is different from that of the second gas supply hole.

Supplementary Note 7

The substrate processing apparatus of Supplementary note 6, wherein the diameter of the first gas supply hole is greater than that of the second gas supply hole.

Supplementary Note 8

The substrate processing apparatus of any one of Supplementary notes 1 through 5, wherein the gas supply holes include a first gas supply hole for supplying the process gas to the peripheral portion of the substrate and a second gas supply hole for supplying the process gas to the central portion of the substrate, and the first gas supply hole and the second gas supply hole are configured so that a flow rate of the process gas passing through the first gas supply hole is greater than that of the process gas passing through the second gas supply hole.

Supplementary Note 9

The substrate processing apparatus of any one of Supplementary notes 1 through 5, wherein the gas supply holes include a first gas supply hole for supplying the process gas to the peripheral portion of the substrate and a second gas supply hole for supplying the process gas to the central portion of the substrate, and a flow velocity of the process gas passing through the first gas supply hole is higher than that of the process gas passing through the second gas supply hole.

Supplementary Note 10

The substrate processing apparatus of any one of Supplementary notes 1 through 9, wherein the process gas at least contains a source gas serving as a precursor, a reactive gas reactive with the precursor and a purge gas, wherein the control unit is configured to control the gas supply unit to perform a cycle at least once, the cycle including: supplying the source gas into the process chamber; supplying the purge gas into the process chamber after supplying the source gas; supplying the reactive gas to the peripheral portion of the substrate after supplying the purge gas; supplying the purge gas after supplying the reactive gas to the peripheral portion of the substrate; supplying the reactive gas to the central portion of the substrate after supplying the purge gas; and supplying the purge gas after supplying the reactive gas to the central portion of the substrate.

Supplementary Note 11

The substrate processing apparatus of Supplementary note 10, wherein the control unit is configured to control the gas supply unit to continuously supply the purge gas.

Supplementary Note 12

The substrate processing apparatus of any one of Supplementary notes 1 through 9, wherein the process gas at least contains a source gas serving as a precursor, a reactive gas reactive with the precursor and a purge gas, wherein the control unit is configured to control the gas supply unit to perform a cycle at least once, the cycle including: supplying the source gas into the process chamber; supplying the purge gas into the process chamber after supplying the source gas; supplying the reactive gas to the peripheral portion of the substrate after supplying the purge gas; supplying the reactive gas to the central portion of the substrate after supplying the reactive gas to the peripheral portion of the substrate; and supplying the purge gas after supplying the reactive gas to the central portion of the substrate.

Supplementary Note 13

According to another aspect of the present invention, there is provided a method of processing a substrate. The method includes: (a) transferring the substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto a central portion of the substrate by the gas supply unit after performing the step (b).

Supplementary Note 14

According to still another aspect of the present invention, there is provided a method of manufacturing a semiconductor device. The method includes: (a) transferring a substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto a central portion of the substrate by the gas supply unit after performing the step (b).

Supplementary Note 15

According to yet another aspect of the present invention, there is provided a method of manufacturing a substrate. The method includes: (a) transferring a substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto a central portion of the substrate by the gas supply unit after performing the step (b).

Supplementary Note 16

According to further another aspect of the present invention, there is provided a program that causes a computer to perform: (a) transferring a substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto the central portion of the substrate by the gas supply unit after performing the sequence (b).

Supplementary Note 17

According to further another aspect of the present invention, there is provided a non-transitory computer-readable recording medium recording a program that causes a computer to perform: (a) transferring a substrate into a process chamber; (b) processing a peripheral portion of the substrate by supplying a process gas onto the peripheral portion of the substrate by a gas supply unit including gas supply holes for supplying the process gas into the process chamber; and (c) processing a central portion of the substrate by supplying the process gas onto the central portion of the substrate by the gas supply unit after performing the sequence (b).

What is claimed is:

1. A substrate processing apparatus comprising:
   a process chamber configured to process a substrate;
   a gas supply unit configured to independently supply a process gas for processing the substrate to each of a central portion of the substrate and a peripheral portion of the substrate in the process chamber, the gas supply unit comprising: a dispersion plate comprising first gas supply holes facing the peripheral portion of the substrate and second gas supply holes facing the central portion of the substrate; a first gas guide defining a first buffer space in communication with the first gas supply holes; and a second gas guide defining a second buffer space in communication with the second gas supply holes; wherein the second gas guide is disposed in the first gas guide; and
   an exhaust unit configured to exhaust an inside of the process chamber; and
   a control unit configured to control the gas supply unit to supply the process gas to the central portion of the substrate after the process gas is supplied to the peripheral portion of the substrate through the gas supply unit.

2. The substrate processing apparatus of claim 1, wherein the process gas is supplied to the peripheral portion of the substrate via the first buffer space and to the central portion of the substrate via the second buffer space.

3. The substrate processing apparatus of claim 2, wherein each of the first gas guide and the second gas guide has a conic shape.

4. The substrate processing apparatus of claim 2, wherein each of the first gas guide has a conic shape having a narrow end thereof connected to a first gas introduction pipe and a wide end thereof in communication with the first gas supply holes, and the second gas guide has a conic shape a conic shape having a narrow end thereof connected to a second gas introduction pipe and a wide end thereof in communication with the second gas supply holes.

5. The substrate processing apparatus of claim 1, wherein the exhaust unit is installed at an outer side in a diametrical direction of the substrate.

6. The substrate processing apparatus of claim 1, wherein an area of the peripheral portion of the substrate where the process gas is supplied through the first gas supply holes is equal to an area of the central portion of the substrate where the process gas is supplied through the second gas supply holes.

7. The substrate processing apparatus of claim 1, wherein a diameter of each of the first gas supply holes is different from that of each of the second gas supply holes.

8. The substrate processing apparatus of claim 7, wherein the diameter of each of the first gas supply holes is greater than that of each of the second gas supply holes.

9. The substrate processing apparatus of claim 1, wherein the first gas supply holes and the second gas supply holes are configured such that a flow rate of the process gas passing through the first gas supply holes is greater than that of the process gas passing through the second gas supply holes.

10. The substrate processing apparatus of claim 1, wherein the first gas supply holes and the second gas supply holes are configured such that a flow velocity of the process gas passing through the first gas supply holes is higher than that of the process gas passing through the second gas supply holes.

11. The substrate processing apparatus of claim 1, wherein the process gas at least contains a source gas serving as a precursor, a reactive gas reactive with the precursor and a purge gas,
   wherein the control unit is configured to control the gas supply unit to perform a cycle at least once, the cycle including: supplying the source gas into the process chamber; supplying the purge gas into the process chamber after supplying the source gas; supplying the reactive gas to the peripheral portion of the substrate after supplying the purge gas; supplying the purge gas after supplying the reactive gas to the peripheral portion of the substrate; supplying the reactive gas to the central portion of the substrate after supplying the purge gas; and supplying the purge gas after supplying the reactive gas to the central portion of the substrate.

12. The substrate processing apparatus of claim 11, wherein the control unit is configured to control the gas supply unit to continuously supply the purge gas.

13. The substrate processing apparatus of claim 1, wherein the process gas at least contains a source gas serving as a precursor, a reactive gas reactive with the precursor and a purge gas, wherein the control unit is configured to control the gas supply unit to perform a cycle at least once, the cycle including: supplying the source gas into the process chamber; supplying the purge gas into the process chamber after supplying the source gas; supplying the reactive gas to the peripheral portion of the substrate after supplying the purge gas; supplying the reactive gas to the central portion of the substrate after supplying the reactive gas to the peripheral portion of the substrate; and supplying the purge gas after supplying the reactive gas to the central portion of the substrate.

\* \* \* \* \*